(12) United States Patent
Tauchi

(10) Patent No.: US 11,581,016 B2
(45) Date of Patent: Feb. 14, 2023

(54) RECORDING LAYER FOR OPTICAL DATA RECORDING MEDIUM, OPTICAL DATA RECORDING MEDIUM, AND SPUTTERING TARGET

(71) Applicant: Kobe Steel, Ltd., Kobe (JP)

(72) Inventor: Yuki Tauchi, Kobe (JP)

(73) Assignee: Kobe Steel, Ltd., Kobe (JP)

( * ) Notice: Subject to any disclaimer, the term of this patent is extended or adjusted under 35 U.S.C. 154(b) by 92 days.

(21) Appl. No.: 17/045,264

(22) PCT Filed: May 8, 2019

(86) PCT No.: PCT/JP2019/018417
§ 371 (c)(1),
(2) Date: Oct. 5, 2020

(87) PCT Pub. No.: WO2019/235119
PCT Pub. Date: Dec. 12, 2019

(65) Prior Publication Data
US 2021/0035606 A1    Feb. 4, 2021

(30) Foreign Application Priority Data

Jun. 7, 2018   (JP) .............................. JP2018-109195

(51) Int. Cl.
*G11B 7/243*     (2013.01)
*C23C 14/08*     (2006.01)
*G11B 7/0045*    (2006.01)

(52) U.S. Cl.
CPC ............. *G11B 7/243* (2013.01); *C23C 14/08* (2013.01); *G11B 7/0045* (2013.01); *G11B 2007/24304* (2013.01)

(58) Field of Classification Search
None
See application file for complete search history.

(56) References Cited

U.S. PATENT DOCUMENTS

| 5,334,433 A * | 8/1994 | Tominaga .......... G11B 7/00452 |
| 2002/0090486 A1* | 7/2002 | Chou ..................... G11B 7/243 |
| | | 428/64.4 |
| 2015/0132606 A1 | 5/2015 | Kurokawa et al. |

(Continued)

FOREIGN PATENT DOCUMENTS

| EP | 0536406 A1 * | 10/1992 | ............... C22C 1/05 |
| EP | 1180767 A2 * | 2/2002 | ......... G11B 7/00454 |
| JP | 2002133712 A * | 5/2002 | ......... G11B 7/00454 |

(Continued)

OTHER PUBLICATIONS

International Search Report dated Jul. 2, 2019 in PCT/JP2019/018417 filed on May 8, 2019.

*Primary Examiner* — William J Klimowicz
(74) *Attorney, Agent, or Firm* — Oblon, McClelland, Maier & Neustadt, L.L.P.

(57) ABSTRACT

A recording layer for an optical data recording medium according to one embodiment of the present invention makes it possible to record an information signal by irradiation with laser beam. The recording layer for an optical data recording medium comprises metal oxides including a Mn oxide, a W oxide, and a Sn oxide. The atomic ratio of Mn with respect to the total number of atoms of metal elements constituting the metal oxides is 3-40 atm %.

10 Claims, 1 Drawing Sheet

(56) References Cited

U.S. PATENT DOCUMENTS

2021/0358728 A1* 11/2021 Kamori ............ C04B 35/62625

FOREIGN PATENT DOCUMENTS

| JP | 2012-139876 A | 7/2012 | | |
|----|---------------|--------|---|---|
| JP | 2017014612 A | * | 1/2017 | ............... B22F 3/00 |
| WO | WO 2013/183277 A1 | 12/2013 | | |
| WO | WO 2017/159561 A1 | 9/2017 | | |
| WO | WO-2018047978 A1 | * | 3/2018 | ............... C22C 1/05 |

* cited by examiner

RECORDING LAYER FOR OPTICAL DATA RECORDING MEDIUM, OPTICAL DATA RECORDING MEDIUM, AND SPUTTERING TARGET

TECHNICAL FIELD

The present invention relates to a recording layer for an optical data recording medium, the optical data recording medium, and a sputtering target.

BACKGROUND ART

Recently, a large-capacity optical disc has been commercialized. There are three types of the large-capacity optical disc depending on a recording and reproduction method, i.e., read-only, write-once, and rewritable. Of these, a recording method of the write-once optical disc is roughly classified into the following types: a phase transition type in which a recording layer undergoes a phase change, an interlayer reaction type in which a plurality of recording layers react with one another, a decomposition type in which a compound constituting a recording layer is decomposed, and a hole making is type in which a recording mark such as a hole or a pit is locally formed in a recording layer.

A recording layer containing Mn oxide is provided as a recording layer of an optical data recording medium configuring the large-capacity optical disc (see Japanese Unexamined Patent Application Publication. No. 2012-139876). When the recording layer is irradiated with laser beam, the Mn oxide is heated and decomposed and releases oxygen ($O_2$ gas), resulting in bubble formation in a portion irradiated with the laser. As a result, a film shape is changed, leading to formation of a recording mark. Specifically, the recording layer is classified as a write-once hole-making type.

The above existing recording layer uses an irreversible recording method using bubble formation associated with laser irradiation on the Mn oxide, and thus achieves a recording layer having a high modulation degree enough to secure a signal amplitude necessary for reproduction of a recording signal, and having a high carrier to noise (C/N) ratio as an output ratio of a read signal to a background noise level.

For the optical data recording medium, power of laser beam reaching the recording layer varies due to uneven thickness or in-plane nonuniformity of the recording layer or the like caused by individual difference in mass production. Hence, the recording layer is required to have a property of preventing signal characteristics of a recorded signal from being deteriorated even if power of recording laser beam varies from the optimum value, in addition to the basic characteristics such as the modulation degree and the C/N ratio.

In the existing recording layer, when power of the recording laser beam varies from the optimum value, signal characteristics are often deteriorated. Hence, there is a demand for a recording layer that can record a high-quality signal without deterioration in signal characteristics even if power of laser beam varies from the optimum value, i.e., a recording layer having a large power margin.

CITATION LIST

Patent Literature

Patent Literature 1: Japanese Unexamined Patent Application Publication No. 2012-139876

SUMMARY OF INVENTION

Technical Problem

The invention, which has been made based on the above-described circumstances, aims to provide a recording layer for an optical data recording medium, which has excellent basic characteristics such as a modulation degree and a C/N ratio and a good power margin, an optical data recording medium using the recording layer, and a sputtering target to form the recording layer.

Solution to Problem

As a result of earnest study on a recording layer that can be increased in power margin, the inventors have found that the recording layer can be increased in power margin by containing W oxide and Sn oxide in addition to Mn oxide while a ratio of atom number of Mn is appropriately controlled, and have completed the invention. The inventors interpret that while a recording mark is formed through bubble formation caused by laser irradiation in the recording layer including the Mn oxide, the recording layer further contains the W oxide and the Sn oxide while the ratio of the atom number of Mn is appropriately controlled, thereby mechanical properties of the recording layer are changed and thus a bubble form is easily stabilized, so that the power margin is increased.

Specifically, one aspect of the invention made to achieve the object is a recording layer for an optical data recording medium that can record an information signal by being irradiated with laser beam. The recording layer includes metal oxides including Mn oxide, W oxide, and Sn oxide, where a ratio of the atom number of Mn to the total atom number of metal elements constituting the metal oxides is 3 atm % to 40 atm %.

Since the irreversible recording method using bubble formation associated with laser irradiation on the Mn oxide is used for the recording layer for the optical data recording medium, the recording layer has excellent basic characteristics such as the modulation degree and the C/N ratio. The recording layer includes the metal oxides including the W oxide and the Sn oxide in addition to the Mn oxide, where the ratio of the atom number of Mn is controlled within the above range. Hence, a bubble formed by laser irradiation on the Mn oxide in the recording layer is readily stabilized by the W oxide and the Sn oxide, resulting in an increase in power margin. Consequently, the recording layer has excellent basic characteristics such as the modulation degree and the C/N ratio and a good power margin.

The ratio of atom number of W to the total atom number of the metal elements constituting the metal oxides is preferably 10 atm % to 65 atm %. The ratio of the atom number of W thus can be adjusted to be within the above range to further increase the power margin while suppressing deterioration in jitter characteristic.

The ratio of atom number of Sn to the total atom number of the metal elements constituting the metal oxides is preferably 5 atm % or more. The ratio of the atom number of Sn thus can be adjusted to be equal to or more than the lower limit to improve the jitter characteristic.

The metal oxides preferably further include Zn oxide. The metal oxides can include Zn oxide to further increase the power margin.

Another aspect of the invention made to achieve the object is an optical data recording medium including the recording layer for the optical data recording medium as one aspect of the invention, and respective protective layers stacked on the surface and the back of the recording layer, each protective layer including a dielectric.

The optical data recording medium includes the recording layer for the optical data recording medium and thus has excellent basic characteristics such as the modulation degree and the C/N ratio and has a good power margin. In addition, the optical data recording medium has the protective layers each including a dielectric, making it possible to increase signal intensity and further improve the basic characteristics.

Still another aspect of the invention made to achieve the object is a sputtering target to form a recording layer for an optical data recording medium, which can record an information signal by being irradiated with laser beam. The sputtering target includes metal elements including at least Mn, W, and Sn, where the ratio of the atom number of Mn to the total atom number of the metal elements is 3 atm % to 40 atm %.

The sputtering target includes the metal elements including at least Mn, W, and Sn, where the ratio of the atom number of Mn to the total atom number of the metal elements is within the above range. The sputtering target, which is to form the recording layer for the optical data recording medium, can be used while the metal elements in the sputtering target are oxidized so that the metal oxides include W oxide and Sn oxide in addition to Mn oxide, and a ratio of the atom number of Mn is easily controlled to be within the above range. Consequently, using the sputtering target makes it possible to easily manufacture the recording layer for the optical data recording medium, which has excellent basic characteristics such as the modulation degree and the C/N ratio and a good power margin.

A ratio of the atom number of W to the total atom number of the metal elements is preferably 10 atm % to 65 atm %. The ratio of the atom number of W thus can be adjusted to be within the above range to manufacture the recording layer for the optical data recording medium having a further increased power margin while suppressing deterioration in jitter characteristic.

A ratio of the atom number of Sn to the total atom number of the metal elements is preferably 5 atm % or more. The ratio of the atom number of Sn thus can be adjusted to be within the above range to manufacture a recording layer for the optical data recording medium having an improved jitter characteristic.

Advantageous Effects of Invention

As described above, the recording layer for the optical data recording medium and the optical data recording medium of the invention each have excellent basic characteristics such as the modulation degree and the C/N ratio and have a good power margin.

DESCRIPTION OF EMBODIMENTS

One embodiment of the invention will now be described in detail with reference to the drawings as necessary.

Optical Data Recording Medium

Figure 1:
FIG. 1 is a schematic side view of a layer configuration of an optical data recording medium according to one embodiment of the invention.

An optical data recording medium as illustrated in FIG. 1 includes a substrate 1, a recording layer 2 for the optical data recording medium, which represents one embodiment of the invention in itself, respective protective layers 3 stacked on a surface and a back of the recording layer 2, and a light transmitting layer 4. The protective layer 3 on the back side of the recording layer 2 is stacked on the substrate 1, and the light transmitting layer 4 is stacked on the protective layer 3 on the surface side of the recording layer 2. That is, the optical data recording medium includes the substrate 1, the recording layer 2 for the optical data recording medium, the protective layers 3, and the light transmitting layer 4 stacked in this order from the bottom.

The optical data recording medium can be used as CD, DVD, and BD, for example. In an exemplary case of using the optical data recording medium for BD-R, for example, blue laser beam having a wavelength of 380 nm to 45 nm, preferably approximately 405 nm can be applied to the recording layer 2 for the optical data recording medium to perform recording and reproduction of data. Power of the laser beam used at this time is practically 5 mW to 15 mW.

Substrate

The substrate 1 is a component to secure strength of the optical data recording medium. A shape of the substrate 1 is appropriately determined according to some criteria such as a standard of the optical data recording medium. For example, if the shape is determined according to the standard of a commercially available large-capacity optical disc, the substrate 1 has a disc-like shape 120 mm in outer diameter, and has unevenness (trenches) as wobbling grooves formed on a surface on which the protective layer 3 is stacked.

A material of the substrate 1 includes polycarbonate, norbornene resin, cyclic olefin copolymer, and amorphous polyolefin.

The lower limit of the average thickness of the substrate 1 is preferably 0.5 mm, more preferably 1 mm. The upper limit of the average thickness of the substrate 1 is preferably 1.2 mm, more preferably 1.1 mm. If the average thickness of the substrate 1 is less than the lower limit, the optical data recording medium may have insufficient strength. Conversely, if the average thickness of the substrate 1 exceeds the upper limit, the optical data recording medium may not meet the standard of the large-capacity optical disc.

Recording Layer for Optical Data Recording Medium

The recording layer 2 for the optical data recording medium can record an information signal by being irradiated with laser beam. The recording layer 2 includes metal oxides including Mn oxide, W oxide, and Sn oxide. The recording layer 2 is of a write-once hole-making type.

Mn Oxide

When the recording layer 2 for the optical data recording medium is irradiated with laser beam, the Mn oxide is heated and decomposed and thus releases oxygen ($O_2$ gas), resulting in bubble formation in a portion irradiated with the laser. As a result, a shape of the recording layer 2 is changed, leading to formation of a recording mark. A portion having a recording mark formed through bubble formation has a higher transmissivity (lower reflectivity) than a portion without bubble formation (portion having no recording mark), and thus the recording layer 2 probably has a large modulation degree.

The recording layer 2 for the optical data recording medium can contain the Mn oxide to increase optical absorptance, allowing laser beam energy to be efficiently converted to heat energy during writing. Consequently, recording sensitivity of the recording layer 2 can be improved.

A form of the Mn oxide may be any normal form without limitation, i.e., may be an oxide including only Mn and oxygen (O), such as MnO, $Mn_3O_4$, $Mn_2O_3$, and $Mn_2$, or may be a composite oxide containing another metal such as W, Zn, and/or Sn, The lower limit of the ratio of atom number of Mn to the total atom number of the metal elements constituting the metal oxides is 3 atm %, preferably 10 atm %. The upper limit of the ratio of the atom number of Mn is 40 atm %, preferably 35 atm % if the ratio of the atom number of Mn is less than the lower limit, the effect of improving the modulation degree or the recording sensitivity of the recording layer 2 for the optical data recording medium may become insufficient. Conversely, if the ratio of the atom number of Mn exceeds the upper limit, atom number of W or Sn relatively decreases, and thus the effect of increasing the power margin may become insufficient.

The recording layer 2 for the optical data recording medium preferably contains no metal Mn. Metal Mn is readily oxidized and/or decomposed, and if the recording layer 2 contains metal Mn, durability of the recording layer 2 and in turn durability of the optical data recording medium may be deteriorated. The phrase "no specified metal element being contained" means that no specified metal element is intentionally contained, i.e., an inevitably contained metal element may exist. The content of the metal element inevitably contained in the recording layer 2 is probably approximately 100 ppm by mass or less in the recording layer 2. That is, "no metal Mn is contained" means that metal Mn is not intentionally contained, and thus the content of metal Mn is 100 ppm by mass or less in the recording layer 2.

Metal Oxides Other Than Mn Oxide

The recording layer 2 for the optical data recording medium includes metal oxides including W oxide and Sn oxide in addition to the Mn oxide. The W oxide and the Sn oxide stabilize a bubble formed by laser irradiation on the Mn oxide in the recording layer 2, and thus increases the power margin. The metal oxides preferably further include Zn oxide. The metal oxides can include the Zn oxide to further increase the power margin.

Like the Mn oxide, the W oxide, the Sn oxide, and the Zn oxide may each have a form of an oxide including such a metal combined only oxygen (O) or a form of a composite oxide containing another metal element.

The lower limit of the ratio of the atom number of W to the total atom number of the metal elements constituting the metal oxides is preferably 10 atm %, more preferably 15 atm %. The upper limit of the ratio of the atom number of W is preferably 65 atm %, more preferably 50 atm %. The ratio of the atom number of W of less than the lower limit may reduce the power margin. Conversely, the ratio of the atom number of W of more than the upper limit relatively decreases the atom number of Sn and thus deteriorates the jitter characteristic, and may cause read error to readily occur.

The lower limit of the ratio of atom number of Sn to the total atom number of the metal elements constituting the metal oxides is preferably 5 atm %, more preferably 10 atm %. The upper limit of a ratio of the atom number of Sn is preferably 60 atm %, more preferably 50 atm %. The ratio of the atom number of Sn of less than the lower limit deteriorates the jitter characteristic, and may cause read error to readily occur. Conversely, the ratio of the atom number of Sn of more than the upper limit relatively decreases the atom number of W, and thus may reduce the power margin.

The lower limit of a ratio of the atom number of W to the atom number of Sn constituting the metal oxides is preferably 0.3, more preferably 0.4. The upper limit of a ratio of the atom number of W to the atom number of Sn is preferably 12, more preferably 10. The ratio of the atom number of W to the atom number of Sn of less than the lower limit may reduce the power margin. Conversely, the ratio of the atom number of W to the atom number of Sn of more than the upper limit relatively reduces the ratio of atom number of Sn and thus deteriorates the jitter characteristic, and may cause read error to readily occur.

When the metal oxides include the Zn oxide, the lower limit of the ratio of atom number of Zn to the total atom number of the metal elements constituting the metal oxides is preferably 5 atm %, more preferably 10 atm %. The upper limit of the ratio of the atom number of Zn is preferably 50 atm %, more preferably 40 atm %. The ratio of the atom number of Zn of less than the lower limit may cause the power margin-increasing effect of the Zn oxide to be insufficient. Conversely, the ratio of the atom number of Zn of more than the upper limit relatively decreases the atom number of W or Sn and thus may reduce the power margin.

The metal oxides may include a metal oxide other than the Mn oxide, the W oxide, the Sn oxide, and the Zn oxide. Such a metal oxide may include In oxide and Cu oxide. In light of the power margin-increasing effect, however, the metal oxides preferably include no oxide other than the Mn oxide, the W oxide, the Sn oxide, and the Zn oxide.

A metal constituting any metal oxide other than the Mn oxide is also preferably not contained in a form of a single metal element. In particular, the metal elements contained in the recording layer 2 for the optical data recording medium are preferably entirely oxidized. For example, metal In, metal Zn, metal Sn, and metal Cu may each take oxygen from another oxide and oxidize, causing deterioration in characteristics of the recording layer 2.

When the protective layer 3 is stacked on each of the surface and the back of the recording layer 2 for the optical data recording medium as in the optical data recording medium, the lower limit of the average thickness of the recording layer 2 is preferably 2 nm, more preferably 5 nm, and most preferably 10 nm. The upper limit of the average thickness of the recording layer 2 is preferably 50 nm, more preferably 40 nm, and most preferably 15 nm. If the average thickness of the recording layer 2 is less than the lower limit, the atom number of Mn in the thickness direction of the recording layer 2 decreases, and thus a recording mark cannot be sufficiently formed, which may cause an insufficient modulation degree. Conversely, if the average thickness of the recording layer 2 exceeds the upper limit, the recording layer 2 is unnecessarily increased in thickness, and thus long time is taken for formation of the recording layer 2, which may cause a reduction in productivity, or may excessively increase laser power necessary for recording.

Advantages

The recording layer 2 for the optical data recording medium has excellent basic characteristics such as the modulation degree and the C/N ratio because of employing the irreversible recording method using bubble formation associated with laser irradiation on the Mn oxide. The recording layer 2 includes the metal oxides including the W oxide and the Sn oxide in addition to the Mn oxide, in which the ratio of the atom number of Mn to the total atom number of the metal elements constituting the metal oxides is controlled to 3 to 40 atom %. Hence, the bubble formed by laser irradiation on the Mn oxide in the recording layer 2 is readily stabilized by the W oxide and the Sn oxide, leading to an increase in power margin. Consequently, the recording layer 2 has excellent basic characteristics such as the modulation degree and the C/N ratio and has a good power margin.

Protective Layer

The protective layer 3 includes a dielectric. In the recording layer 2 for the optical data recording medium, while an oxygen bubble is formed upon laser irradiation, the dielectric prevents the bubble from escaping, which suppresses a reduction in reflectivity of the recording layer 2. The optical data recording medium therefore includes the dielectric as the protective layer 3 to help the modulation degree of the recording layer 2 to be secured.

Examples of a material of the dielectric constituting the protective layer 3 may include known dielectrics such as oxides of Si, Al, In, Zn, Zr, Ti, Nb, Ta, Cr, and Sn, nitrides of Si, Al, In, Ge, Cr, Nb, Mo, and Ti, Zn sulfide, carbides of Cr, Si, Al, Ti, Zr, and Ta, and fluorides of Mg, Ca, and La. Of these, $In_2O_3$ as one In oxide is preferable in light of productivity or recording sensitivity of the optical data recording medium. Such dielectrics may be used in combination.

The lower limit of the average thickness of the protective layer 3 is preferably 2 nm, more preferably 3 nm. The upper limit of the average thickness of the protective layer 3 is preferably 30 nm, more preferably 25 nm. If the average thickness of the protective layer 3 is less than the lower limit, the effect of preventing bubble escape may become insufficient, the bubble being formed upon laser irradiation on the recording layer 2 for the optical data recording medium. Conversely, if the average thickness of the protective layer 3 exceeds the upper limit, light interference tends to occur, and thus a bubble is less likely to be formed in the recording layer 2, which may reduce recording sensitivity of the optical data recording medium.

Light Transmitting Layer

The light transmitting layer 4 smooths the surface of the optical data recording medium to help incidence of laser beam, and prevents corrosion of the protective layer 3 or the recording layer 2 for the optical data recording medium.

A usable material of the light transmitting layer 4 has a high transmissivity and a low absorptivity of laser beam for recording and reproduction. Specifically, examples of a usable material of the light transmitting layer 4 include polycarbonate and ultraviolet curable resin.

The lower limit of the average thickness of the light transmitting layer 4 is preferably 0.01 mm, more preferably 0.015 mm. The upper limit of the average thickness of the light transmitting layer 4 is preferably 0.2 mm, more preferably 0.15 mm. If the average thickness of the light transmitting layer 4 is less than the lower limit, the corrosion-preventing effect on the protective layer 3 or the recording layer 2 for the optical data recording medium may become insufficient. Conversely if the average thickness of the light transmitting layer 4 exceeds the upper limit, a numerical aperture (NA) becomes excessively small, and thus a fine recording mark may not be recorded.

Method for Manufacturing Optical Data Recording Medium

The optical data recording medium can be manufactured by a manufacturing method including, for example, a substrate preparation step, a step of stacking the back protective layer, a step of stacking the recording layer for an optical data recording medium, a step of stacking the surface protective layer, and a step of stacking the light transmitting layer.

Substrate Preparation Step

In the substrate preparation step, the substrate 1 is prepared so as to have unevenness as wobbling grooves formed on a surface on which the protective layer 3 is stacked.

Such a substrate 1 can be formed by transferring an uneven pattern of wobbling grooves for tracking from a mastering original disc by injection molding or the like.

Step of Stacking Back Protective Layer

In the step of stacking the back protective layer, the protective layer 3 is stacked on the surface of the substrate 1 prepared in the substrate preparation step.

A usable method for stacking the protective layer 3 on the surface of the substrate 1 includes a known film formation method such as a sputter process using a sputtering target having the same composition as the dielectric constituting the protective layer 3.

Step of Stacking Recording Layer for Optical Data Recording Medium.

In the step of stacking the recording layer for the optical data recording medium, the recording layer 2 for the optical data recording medium is stacked on a surface side of a stacked body including the substrate 1 and the protective layer 3 stacked on the substrate 1 in the step of stacking the back protective layer.

The recording layer 2 for the optical data recording medium includes the metal oxides including the Mn oxide, the W oxide, and the Sn oxide. A sputtering process is preferably used to produce such a recording layer including a plurality of oxides. The sputtering process is advantageously used to easily secure uniformity of the thickness of the recording layer 2.

A sputtering target containing at least Mn, W, and Sn as metal elements is used as the sputtering target to form the recording layer 2 for the optical data recording medium. The lower limit of a ratio of the atom number of Mn to the total atom number of the metal elements is 3 atm %, preferably 10 atm %. The upper limit of the ratio of the atom number of Mn is 40 atm %, preferably 35 atm %.

The sputtering target can be used while the metal elements contained therein are oxidized so that the recording layer 2 for the optical data recording medium is produced so as to include the metal oxides including the W oxide and the Sn oxide in addition to the Mn oxide. The ratio of the atom number of Mn in the recording layer 2 can be easily controlled to be within the above range. Consequently, using the sputtering target makes it possible to easily manufacture the recording layer 2 having excellent basic characteristics such as the modulation degree and the C/N ratio and a good power margin.

The lower limit of the ratio of the atom number of W to the total atom number of the metal elements is preferably 10 atm %, more preferably 15 atm %. The upper limit of the ratio of the atom number of W is preferably 65 atm %, more preferably 50 atm %. The ratio of the atom number of W of less than the lower limit may reduce the power margin of the recording layer 2 for the optical data recording medium produced using the sputtering target. Conversely, the ratio of the atom number of W of more than the upper limit relatively reduces the ratio of the atom number of Sn, which reduces the jitter characteristic of the recording layer 2 produced using the sputtering target, and may cause read error to easily occur.

The lower limit of the ratio of the atom number of Sn to the total atom number of the metal elements is preferably 5 atm %, more preferably 10 atm %. The upper limit of the ratio of the atom number of Sn is preferably 60 atm %, more preferably 50 atm %. The ratio of the atom number of Sn of less than the lower limit deteriorates the jitter characteristic of the recording layer 2 for the optical data recording medium produced using the sputtering target, and may cause read error to easily occur. Conversely, the ratio of the atom number of Sn of more than the upper limit relatively reduces the ratio of the atom number of W, which may reduce the power margin of the recording layer 2 produced using the sputtering target.

When the recording layer 2 for the optical data recording medium is formed by a sputtering process, reactive sputtering is preferably used. In the reactive sputtering, while the sputtering target is sputtered, oxygen is supplied to promote oxidation.

Oxygen is supplied using atmosphere gas including oxygen gas diluted with an inert gas (for example, Ar gas). The lower limit of a ratio of oxygen flowrate to Ar flowrate in the atmosphere gas is preferably half times, more preferably one time. The upper limit of the ratio of oxygen flowrate is preferably five times. If the ratio of oxygen flowrate is less than the lower limit, oxidation of metal is insufficient, and the metal elements tend to remain in the recording layer 2 for the optical data recording medium, and thus durability of the optical data recording medium may be deteriorated. Conversely, if the ratio of oxygen flowrate exceeds the upper limit, an oxidation reaction becomes excessively vigorous, and the recording layer 2 is formed with a low denseness, and thus the basic characteristics such as the modulation degree and the C/N ratio may be deteriorated.

Other sputtering conditions can be determined in the usual manner such that gas pressure is 0.1 Pa to 1 Pa, sputter power is 0.2 W/cm$^2$ to 20 W/cm$^2$, and substrate temperature is room temperature (20°C to 30° C.), for example.

Step of Stacking Surface Protective Layer

In the step of stacking the surface protective layer, the protective layer 3 is stacked on the surface side of a stacked body having the recording layer 2 for the optical data recording medium stacked in the step of stacking the recording layer for the optical data recording medium. The step of stacking the surface protective layer can be performed in the same way as the step of stacking the back protective layer.

Step of Stacking Light Transmitting Layer

In the step of stacking the light transmitting layer, the light transmitting layer 4 is stacked on the surface side of the stacked body having the surface protective layer 3 stacked in the surface protective layer stacking step.

The light transmitting layer 4 can be stacked using any one of known methods depending on some factors such as characteristics of a material to be used. For example, in case of using ultraviolet curable resin for the light transmitting layer 4, an ultraviolet curable resin composite can be applied by spin coating or the like and then irradiated with light to form the light transmitting layer 4.

Advantages

The optical data recording medium has the recording layer 2 for the optical data recording medium, and thus has excellent basic characteristics such as the modulation degree and the C/N ratio and has a good power margin. In addition, the optical data recording medium has the protective layer 3 including a dielectric, making it possible to increase signal intensity and further improve the basic characteristics.

Other Embodiments

The invention should not be limited to the above-described embodiment.

Although the above-described embodiment has been described with the optical data recording medium having the protective layer stacked on each of the surface and the back of the recording layer for the optical data recording medium, the recording layer may have the protective layer stacked on only one side thereof, or may not have such a protective layer. When the optical data recording medium has no protective layer, a metal reflection layer is preferably provided on the back of the recording layer. The reflection layer thus can be provided to increase signal intensity. Metals configuring the reflection layer include single metals such as Ag, Au, Cu, Al, Ni, Cr, and Ti, and alloys of such metals.

When the recording layer for the optical data recording medium has no protective layer on its surface and back and is thus used as a single layer, the lower limit of the average thickness of the recording layer is preferably 10 nm, more preferably 20 nm, and most preferably 30 nm. The upper limit of the average thickness of the recording layer is preferably 60 nm, more preferably 50 nm, and most preferably 45 nm. If the average thickness of the recording layer is less than the lower limit, a reflectivity necessary for reading the applied laser beam may not be given. Conversely, if the average thickness of the recording layer exceeds the upper limit, since the recording layer has an unnecessarily large thickness, much time is required for formation of the recording layer, which may reduce productivity or may excessively increase laser power required for recording.

The optical data recording medium may have, in addition to the protective layer, an optical adjustment layer including oxide, nitride, or sulfide on the surface side or the back side of the recording layer for the optical data recording medium. The optical adjustment layer thus can be provided to improve durability of the recording layer and further improve recording characteristics.

Although the above-described embodiment has been described with the single-layer optical data recording medium having one recording layer for the optical data recording medium and one light transmitting layer, a multilayer optical data recording medium may also be used so as to have two or more recording layers and two or more light transmitting layers.

In the multilayer optical data recording medium, recording layer groups, which each include the recording layer for the optical data recording medium and include the optical adjustment layer and/or the protective layer stacked as necessary, are stacked on one another with a transparent intermediate layer in between in a thickness direction of the optical data recording medium. For example, transparent resin such as ultraviolet curable resin or polycarbonate can be used for the transparent intermediate layer. In the optical data recording medium having such a multilayer structure, a focal position of laser is adjusted in a thickness direction during laser irradiation to select a layer to which information is recorded, and thus multilayer recording is achieved. Thickness of the transparent intermediate layer is appropriately determined so as not to cause crosstalk between the recording layer groups provided as upper and lower layers of the intermediate layer.

Although the above-described embodiment has been described with a case where the sputtering target containing metal elements including at least Mn, W, and Sn, in which the ratio of the atom number of Mn to the total atom number of the metal elements is 3 atm % to 40 atm %, is used as a sputtering target for forming the recording layer for the optical data recording medium, the recording layer can be formed using other sputtering targets. Examples of other usable sputtering targets include targets of metal Mn, metal W, and metal Sn. Alternatively, targets of Mn oxide, W oxide, and Sn oxide may be used as the sputtering targets. A mixture of the metal targets and the oxide targets may also be used.

EXAMPLES

Although the invention is now described in detail according to Examples, the invention should not be limited to such Examples.

Example 1

A polycarbonate substrate (12 mm in diameter, 1.1 mm in average thickness, 0.32 μm in track pitch, and 33 nm in trench depth) was prepared as a substrate of an optical data recording medium.

The back protective layer, the recording layer for the optical data recording medium, which may be simply referred to as "recording layer" hereinafter, and the surface protective layer were stacked in this order on the substrate, The surface protective layer and the back protective layer were formed by a usual DC magnetron sputtering process. Material of the protective layer included metal oxides containing Sn, Zn and Zr in atom number ratios of 40 atm %, 40 atm %, and 20 atm %, respectively, for either of the surface side and the back side. The average thickness of the protective layer was 14 nm. Atmosphere gas during sputtering was adjusted into Ar flowrate of 20 sccm and $O_2$ flowrate of 1 sccm.

Each recording layer was controllably formed so as to have a composition as shown in Table 1 by a multitarget sputter process with prepared sputtering targets of metal Mn, metal Sn, and metal W being prepared. In the sputtering condition at this time, Ar flowrate was 10 sccm, $O_2$ flowrate was 10 sccm, gas pressure was 0.26 Pa, substrate temperature was 25° C. (room temperature), and sputter power was adjusted in a range from 0.2 W/cm$^2$ to 3 W/cm$^2$ depending on target compositions. The average thickness of the recording layer was 32 nm.

In this way, the light transmitting layer was stacked on the surface (surface of the surface protective layer) of a stacked body formed by the sputtering process. An ultraviolet curing resin composite ("BRD-864" from Nippon Kayaku Co., Ltd.) was applied by spin coating and then irradiated with ultraviolet rays to form the light transmitting layer. The average thickness of the light transmitting layer was 0.1 mm.

As described above, the optical data recording medium of Example 1 was produced.

Examples 2 to 4

Optical data recording media of Examples 2 to 4 were produced in the same way as the Example 1 except that each recording layer was controllably formed so as to have a composition as shown in Table 1.

Examples 5 and 6

Optical data recording media of Examples 5 and 6 were produced in the same way as the Example 1 except that metal Zn was further prepared, and each recording layer was controllably formed so as to have a composition as shown in Table 1.

Comparative Examples 1 to 4

Optical data recording media of comparative examples 1 to 4 were produced in the same way as the Example 1 except that each recording layer was controllably formed so as to have a composition as shown in Table 1.

In Table 1, "-" in the column of "number of metal atoms in metal oxides in recording layer" represents that the relevant atom is not contained. Specifically, sputtering was performed without a corresponding sputtering target loaded. In the comparative example 3, sputtering was performed with an additional $In_2O_3$ target as a sputtering target of In.

Composition Determination

The number of metal atoms in the recording layer of each of the Examples 1 to 6 and the comparative examples 1 to 4 was determined using a fluorescent X-ray analyzer (XRF). Specifically, a desktop wavelength-dispersive X-ray fluorescence analyzer "ZSX-MIN" from Rigaku Corporation was used to calculate a ratio of atom number of an object element from fluorescent X-ray intensity. Table 1 shows the results.

Evaluation of Optical Data Recording Medium

The optical data recording media of the Examples 1 to 6 and the comparative examples 1 to 4 were evaluated in modulation degree, jitter, and power margin (except for the modulation degree of the comparative example 4).

Evaluation Apparatus

For evaluation of recording signal characteristics of each optical data recording medium, an optical disc evaluation apparatus "ODU-1000" (a central wavelength of a recording laser of 405 nm and an aperture factor (NA) of 0.85) from Pulstec Industrial Co., Ltd, was used to apply reproduction/recording laser having a reference clock of 66 MHz for recording and reading to/from the optical data recording medium. Recording operation was performed with RLL (Run Length Limited) (1, 7) PP modulation (Parity Preserve/Prohibit rmtr (repeated minimum transition runlength)), and signals were recorded in adjacent five tracks and signal characteristics at a central track were evaluated, Linear velocity of the optical data recording medium was 4.92 m/s, and laser power in reproduction was 0.7 mW.

Modulation Degree

The modulation degree was determined as follows: A digital oscilloscope "DL1640" from Yokogawa Electric Corporation was used, the maximum reflectivity and the minimum reflectivity were measured in a portion where a signal was recorded, and the modulation degree was calculated by Formula (1).

$$\text{Modulation degree} = (\text{maximum reflectivity} - \text{minimum reflectivity}) / \text{maximum reflectivity} \quad (1)$$

Figure 2:
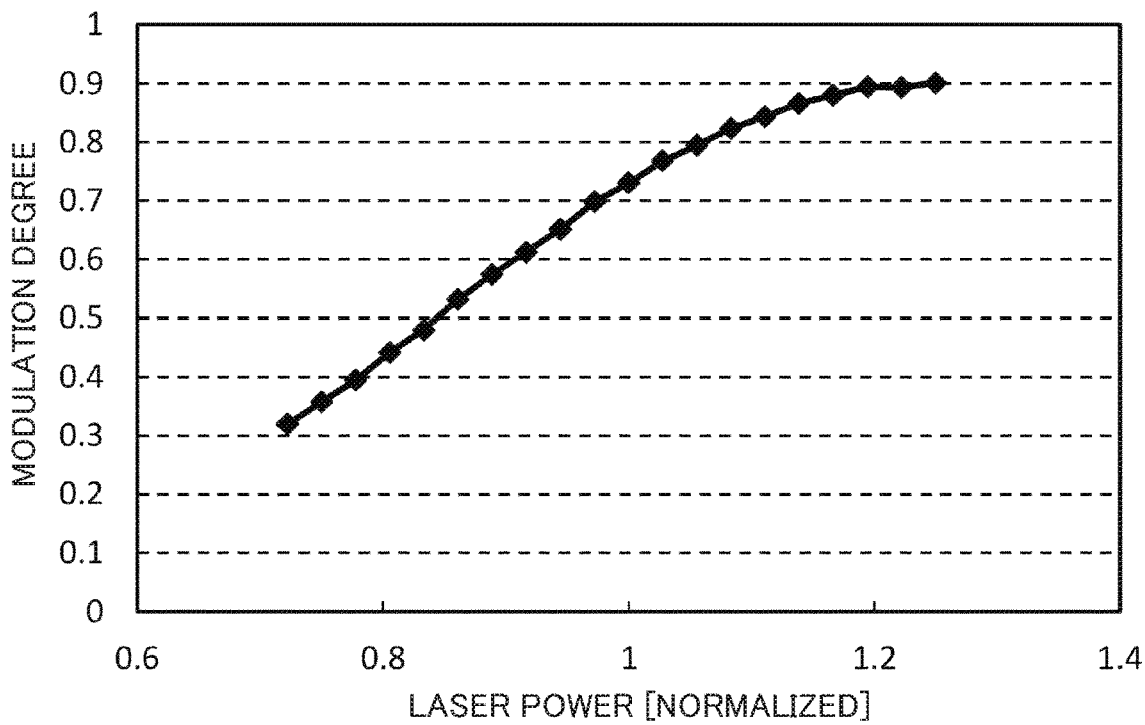
FIG. 2 is a graph illustrating a measurement example of a modulation degree in Example.

As illustrated in FIG. 2, the modulation degree varies with a variation in laser power during recording. The modulation degree in recording at a laser power with the minimum jitter as described later was therefore defined to be a modulation degree of each optical data recording medium. In the graph of FIG. 2, since laser power is normalized with the laser power with the minimum jitter, the modulation degree of each optical data recording medium corresponds to a modulation degree at laser power of 1. Table 1 shows the results, The modulation degree implies that as its numerical value increases, reflected light more greatly varies, allowing a signal to be more easily read. In this case, a modulation degree of 0.5 or more was determined to be a good modulation degree.

Jitter

Figure 3:
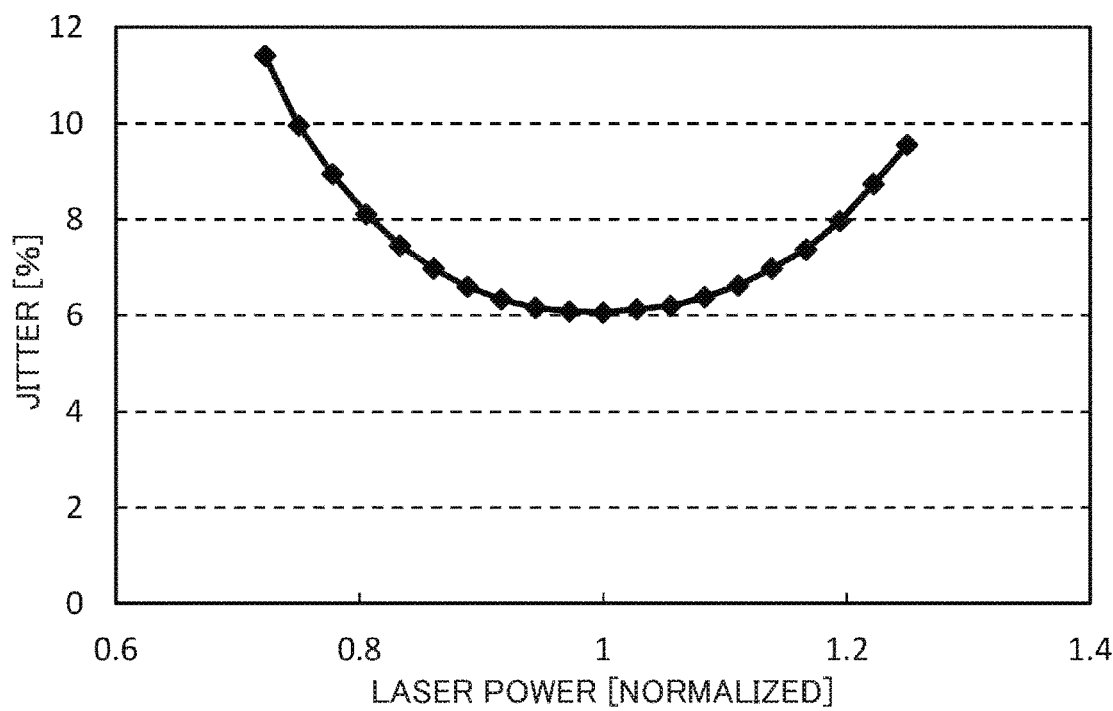
FIG. 3 is a graph illustrating a measurement example of a jitter in the Example.

Jitter was measured using a time interval analyzer "TA520" from Yokogawa Electric Corporation. As illustrated in FIG. 3, the jitter varies with a variation in laser power during recording, and has a minimum value at a certain power. Such a minimum value was defined to be jitter of each optical data recording medium. Table 1 shows the results.

As the jitter has a smaller numerical value, reading accuracy is higher. In this case, jitter of 6.5% or less was determined to be good jitter.

Power Margin

Power margin was calculated according to the following procedure. First, laser power was normalized with a laser power with the minimum jitter (see FIG. 3). The normalized laser power at a jitter of 8.5% was obtained from the result of such normalization of laser power. Since the minimum value of jitter of each optical data recording medium is less than 8.5%, the normalized laser power exists at two points. The two respective points are shown as a low power side and a high power side in Table 1.

The power margin becomes better as it is smaller than 1 as a normalized value on the low-power side (always less than 1), and becomes better as it is larger than 1 on the high-power side (always more than 1). In this case, a power margin of 0.85 or less on the low-power side and a power margin of 1.2 or more on the high-power side were determined to be a good power margin.

power margin on the low power side than any of the optical data recording media of the Examples 1 to 4. This reveals that the metal oxides in the recording layer can include the Zn oxide to further increase the power margin.

INDUSTRIAL APPLICABILITY

As described above, the recording layer for the optical data recording medium and the optical data recording medium of the invention each have good basic characteristics such as the modulation degree and the C/N ratio and have a good power margin.

LIST OF REFERENCE SIGNS

1 Substrate
2 Recording layer for optical data recording medium
3 Protective layer
4 Light transmitting layer

The invention claimed is:
1. A recording layer for an optical data recording medium, the recording layer being capable of recording an informa-

TABLE 1

| | Number of metal atoms in metal oxides in recording layer | | | | | Modulation degree | Minimum value of jitter (%) | Power margin | |
|---|---|---|---|---|---|---|---|---|---|
| | Mn (atm %) | W (atm %) | Sn (atm %) | Zn (atm %) | In (atm %) | | | Low power side (normalized value) | High power side (normalized value) |
| Example 1 | 32 | 62 | 6 | — | — | 0.55 | 6.3 | 0.83 | 1.26 |
| Example 2 | 35 | 49 | 16 | — | — | 0.61 | 6.1 | 0.83 | 1.26 |
| Example 3 | 36 | 29 | 35 | — | — | 0.73 | 6.1 | 0.83 | 1.20 |
| Example 4 | 27 | 21 | 52 | — | — | 0.68 | 6.0 | 0.82 | 1.25 |
| Example 5 | 27 | 16 | 42 | 15 | — | 0.80 | 5.6 | 0.79 | 1.21 |
| Example 6 | 14 | 20 | 36 | 30 | — | 0.72 | 5.9 | 0.79 | 1.29 |
| Comparative example 1 | 34 | — | — | 66 | — | 0.82 | 7.1 | 0.89 | 1.05 |
| Comparative example 2 | 49 | 51 | — | — | — | 0.58 | 6.7 | 0.90 | 1.22 |
| Comparative example 3 | 23 | — | — | — | 77 | 0.53 | 8.3 | 0.97 | 1.08 |
| Comparative example 4 | 29 | — | 71 | — | — | — | 8.2 | 0.94 | 1.11 |

In Table 1, "-" in the modulation degree of the comparative example 4 represents that the modulation degree is unmeasured.

As shown in Table 1, the optical data recording media of the Examples 1 to 6, each including the recording layer including metal oxides including Mn oxide, W oxide, and Sn oxide, are good in jitter and power margin, specifically in power margin on the low power side but equivalent in modulation degree compared with the optical data recording media of the comparative examples 1 to 4.

In contrast, the optical data recording media of the comparative examples 2 and 4, each including the recording layer including the Mn oxide and only one of the oxides of W and Sn, are bad in power margin on the low power side. The optical data recording medium of the comparative example 4 is further bad in jitter. The optical data recording media of the comparative examples 1 and 3, each including the recording layer containing no W oxide and no Sn oxide, are bad in power margin on both the low-power side and the high-power side. These reveal that the recording layer can contain the Mn oxide, the W oxide, and the Sn oxide to increase the power margin of the optical data recording medium.

More in detail, the optical data recording media of the Examples 5 and 6 are each smaller in jitter and better in tion signal by being irradiated with laser beam, the recording layer comprising metal oxides comprising Mn oxide, W oxide, and Sn oxide, wherein a ratio of Mn content to a total of metal elements constituting the metal oxides is 3 atm % to 40 atm %, and a ratio of Sn content to the total of the metal elements constituting the metal oxides is 5 atm % or more.

2. The recording layer for the optical data recording medium according to claim 1, wherein a ratio of W content to the total of the metal elements constituting the metal oxides is 10 atm % to 65 atm %.

3. The recording layer for the optical data recording medium according to claim 2, wherein the metal oxides further comprise Zn oxide.

4. The recording layer for the optical data recording medium according to claim 2, wherein a ratio of W content to the total of the metal elements constituting the metal oxides is 15 atm % to 50 atm %.

5. The recording layer for the optical data recording medium according to claim 1, wherein the metal oxides further comprise Zn oxide.

6. An optical data recording medium, comprising:
the recording layer for the optical data recording medium according to claim 1, and
respective protective layers stacked on a surface and a back of the recording layer for the optical data recording medium,
wherein the protective layers each comprise a dielectric.

7. The recording layer for the optical data recording medium according to claim 1, wherein a ratio of Sn content to the total of the metal elements constituting the metal oxides is 52 atm % or less.

8. The recording layer for the optical data recording medium according to claim 1, wherein:
a ratio of Mn content to a total of metal elements constituting the metal oxides is 14 atm % to 36 atm %,
a ratio of W content to the total of the metal elements constituting the metal oxides is 16 atm % to 62 atm %, and
a ratio of Sn content to the total of the metal elements constituting the metal oxides is 6 atm % to 52 atom %.

9. The recording layer for the optical data recording medium according to claim 1, wherein:
the recording layer is foiined by using a sputtering target comprising metal elements comprising Mn, W, and Sn,
a ratio of Mn content to a total of the metal elements constituting the sputtering target is 3 atm % to 40 atm %, and
a ratio of Sn content to the total of the metal elements constituting the sputtering target is 5 atm % or more.

10. The recording layer for the optical data recording medium according to claim 9, wherein a ratio of W content to the total of the metal elements constituting the sputtering target is 10 atm % to 52 atm %.

* * * * *